(12) United States Patent
Lee et al.

(10) Patent No.: US 11,177,464 B2
(45) Date of Patent: Nov. 16, 2021

(54) DISPLAY APPARATUS

(71) Applicant: SAMSUNG DISPLAY CO., LTD., Yongin-si (KR)

(72) Inventors: Takyoung Lee, Yongin-si (KR); Jaewook Kang, Yongin-si (KR); Yunmo Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/534,507

(22) Filed: Aug. 7, 2019

(65) Prior Publication Data

US 2020/0083474 A1    Mar. 12, 2020

(30) Foreign Application Priority Data

Sep. 11, 2018  (KR) .......................... 10-2018-0108510

(51) Int. Cl.
*H01L 27/32* (2006.01)
*H01L 51/52* (2006.01)

(52) U.S. Cl.
CPC ........ *H01L 51/529* (2013.01); *H01L 27/3276* (2013.01); *H01L 51/5246* (2013.01)

(58) Field of Classification Search
CPC ............... H01L 51/529; H01L 51/5246; H01L 27/3276
See application file for complete search history.

(56) References Cited

U.S. PATENT DOCUMENTS

| 8,884,849 | B2 | 11/2014 | Masuda |
| 9,064,831 | B2 | 6/2015 | Noh |
| 9,362,531 | B2 | 6/2016 | Hong |
| 9,444,069 | B2 | 9/2016 | Murakami et al. |
| 2007/0176550 | A1* | 8/2007 | Kwan ................. H01L 51/5246 313/512 |
| 2007/0187676 | A1* | 8/2007 | Park .................... H01L 27/1285 257/40 |
| 2016/0275869 | A1 | 9/2016 | Hwang et al. |

FOREIGN PATENT DOCUMENTS

| JP | 5620492 B2 | 9/2014 |
| KR | 10-0714000 B1 | 5/2007 |
| KR | 10-2013-0007513 A | 1/2013 |
| KR | 10-2015-0007870 A | 1/2015 |
| KR | 10-2015-0043136 A | 4/2015 |
| KR | 10-2017-0025653 A | 3/2017 |

* cited by examiner

*Primary Examiner* — Moazzam Hossain
(74) *Attorney, Agent, or Firm* — Kyle Park Reed Houtteman PLLC

(57) ABSTRACT

A display apparatus includes a lower substrate including a peripheral area around a display area, an upper substrate facing the lower substrate, a display unit in the display area including a pixel circuit and a display device electrically connected to the pixel circuit, a seal in the peripheral area to surround the display unit, the seal adhering the lower substrate to the upper substrate, a power supply line between the lower substrate and the seal such that at least a portion of the power supply line and the seal overlap each other, and a first thermally conductive layer between the power supply line and the lower substrate, at least a part of the first thermally conductive layer overlapping an end portion of the power supply line, the first thermally conductive layer being connected to the power supply line and extending toward an edge of the lower substrate.

20 Claims, 8 Drawing Sheets

DISPLAY APPARATUS

CROSS-REFERENCE TO RELATED APPLICATION

Korean Patent Application No. 10-2018-0108510, filed on Sep. 11, 2018, in the Korean Intellectual Property Office, and entitled: "Display Apparatus," is incorporated by reference herein in its entirety.

BACKGROUND

1. Field

Embodiments relate to a display apparatus.

2. Description of the Related Art

Since an organic light-emitting display apparatus is a self-emissive display apparatus that does not need an additional light source, the organic light-emitting display apparatus may operate at a low voltage and may be configured as a lightweight thin apparatus. Also, since the organic light-emitting display apparatus has high quality characteristics such as a wide viewing angle, a high contrast ratio, and a fast response time, the organic light-emitting display apparatus has attracted attention as a next-generation display apparatus.

SUMMARY

Embodiments are directed to a display apparatus including a lower substrate including a display area and a peripheral area around the display area, an upper substrate facing the lower substrate, a display unit located in the display area, the display unit including a pixel circuit and a display device electrically connected to the pixel circuit, a seal located in the peripheral area to surround the display unit, the seal adhering the lower substrate to the upper substrate, a power supply line located between the lower substrate and the seal such that at least a portion of the power supply line and the seal overlap each other, and a first thermally conductive layer located between the power supply line and the lower substrate such that at least a part of the first thermally conductive layer overlaps an end portion of the power supply line, the first thermally conductive layer being connected to the power supply line and extending toward an edge of the lower substrate.

The display apparatus may further include a first connection layer located between the power supply line and the first thermally conductive layer. The power supply line and the first thermally conductive layer may be connected to each other through the first connection layer.

The first connection layer may extend to the edge of the lower substrate such that an end surface of the first connection layer and an end surface of the edge of the lower substrate are aligned with each other.

An end surface of an end portion of the first thermally conductive layer may be exposed to the outside.

At least a part of the first thermally conductive layer including the end surface may have a pattern.

The end surface of the end portion of the first thermally conductive layer and an outer wall of the seal may be on a same plane.

The display apparatus may further include a first driver located under the power supply line and overlapping the seal, the first driver being located between the first thermally conductive layer and the display unit.

The display apparatus may further include a second thermally conductive layer connected to the power supply line and located between the power supply line and the lower substrate such that at least a part of the second thermally conductive layer and another end portion of the power supply line overlap each other.

The second thermally conductive layer and the first thermally conductive layer may be made of a same material.

The display apparatus may further include a second connection layer located between the power supply line and the second thermally conductive layer. The power supply line and the second thermally conductive layer may be connected to each other through the second connection layer.

The second connection layer is located between the seal and the display unit.

The display apparatus may further include a first driver located in an area between the first thermally conductive layer and the second thermally conductive layer located under the power supply line to overlap the seal and a second driver located in an area between the display unit and the second thermally conductive layer.

The second thermally conductive layer may extend toward the first driver.

The first driver may include an emission control driving circuit and the second driver may include a scan driving circuit.

The pixel circuit of the display unit may include a thin-film transistor including a semiconductor layer, a gate electrode having at least a part that overlaps the semiconductor layer, and a first conductive layer including at least one of a source electrode and a drain electrode, a storage capacitor located between the gate electrode and the first conductive layer, the storage capacitor including an upper electrode having at least a part that overlaps the gate electrode, and a second conductive layer located on the first conductive layer.

The power supply line and the second conductive layer may be made of a same material.

The first thermally conductive layer and the upper electrode may be made of a same material.

The display apparatus may further include a first interlayer insulating layer located between the gate electrode and the upper electrode, a second interlayer insulating layer located between the upper electrode and the first conductive layer, and an inorganic insulating layer located between the upper electrode and the second conductive layer. The first interlayer insulating layer, the second interlayer insulating layer, and the inorganic insulating layer extend to the edge of the lower substrate, and the power supply line is located on the inorganic insulating layer.

Outer walls of the lower substrate, the upper substrate, and the seal may be aligned with one another.

The first thermally conductive layer may include a metal material that is less reactive than a metal material of the power supply line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
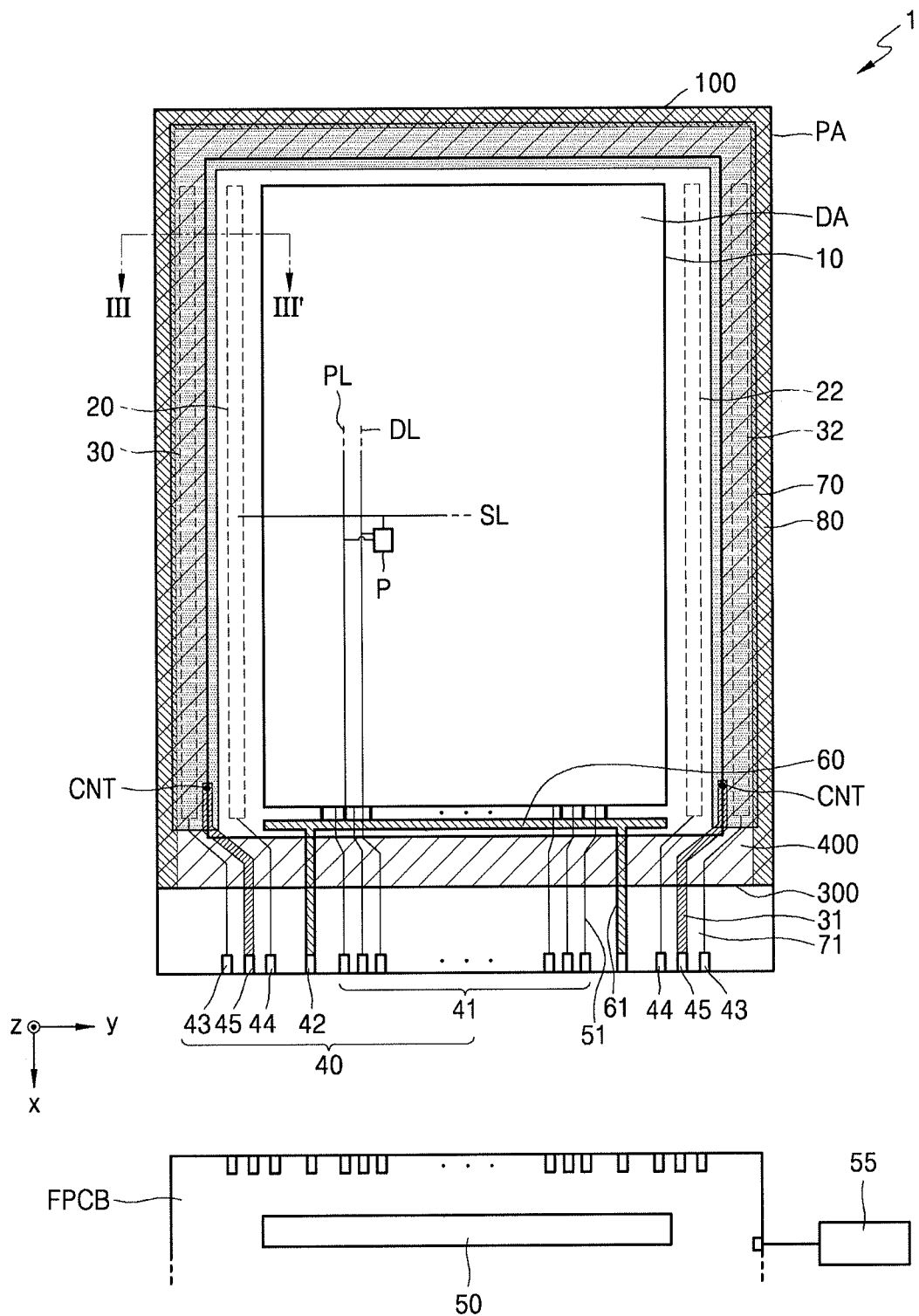
FIG. 1 illustrates a plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Examples of a display apparatus for displaying an image may include a liquid crystal display, an electrophoretic display, an organic light-emitting display, an inorganic light-emitting display, a field emission display, a surface-conduction electron-emitter display, a plasma display, and a cathode ray display. Although an organic light-emitting display apparatus will be described as a display apparatus according to an embodiment, various types of display apparatuses may be used.

Figure 2:
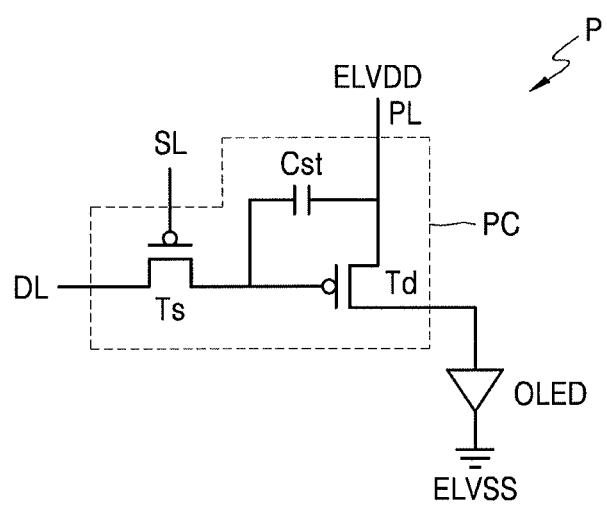
FIG. 2 illustrates an equivalent circuit diagram of a pixel of the display apparatus according to an embodiment.

FIG. 1 illustrates a plan view of a display apparatus 1 according to an embodiment. FIG. 2 illustrates an equivalent circuit diagram of a pixel of the display apparatus 1 according to an embodiment.

Referring to FIG. 1, the display apparatus 1 may include a display unit 10 located on a lower substrate 100. The display unit 10 may include pixels P connected to a scan line SL extending in a y-direction and a data line DL extending in an x-direction perpendicular to the y-direction. The display unit 10 may provide a predetermined image through light emitted by the pixels P and may define a display area DA.

Each pixel P may emit, for example, red, green, blue, or white light. Each pixel P may include a display device. The display device may include an organic light-emitting diode (OLED). The term 'pixel P' used herein refers to a pixel that emits red, green, blue, or white light as described above.

Referring to FIG. 2, the pixel P may include a pixel circuit PC connected to the scan line SL and the data line DL and an OLED connected to the pixel circuit PC. The pixel circuit PC may include a driving thin-film transistor (TFT) Td, a switching TFT Ts, and a storage capacitor Cst. The switching TFT Ts may be connected to the scan line SL and the data line DL. The switching TFT Ts may transmit a data signal input through the data line DL to the driving TFT Td according to a scan signal input through the scan line SL.

The storage capacitor Cst may be connected to the switching TFT Ts and a driving voltage line PL. The storage capacitor Cst may store a voltage corresponding to a difference between a voltage received from the switching TFT Ts and a driving voltage ELVDD supplied to the driving voltage line PL.

The driving TFT Td may be connected to the driving voltage line PL and the storage capacitor Cst. The driving TFT Td may control driving current flowing through the OLED from the driving voltage line PL according to a value of the voltage stored in the storage capacitor Cst. The OLED may emit light having a predetermined luminance due to the driving current. The OLED may emit, for example, red, green, blue, or white light.

Referring to FIG. 2, the pixel P is shown as including two TFTs and one storage TFT. In some implementations, various modifications may be made. For example, the pixel circuit PC of the pixel P may include three or more TFTs or may include two or more capacitors Cst.

Referring back to FIG. 1, a peripheral area PA may be located outside the display area DA. For example, the peripheral area PA may surround the display area DA. The portion of the peripheral area PA where the pixels P are not located may be a non-display area where no image is provided.

A driving circuit including, for example, a first driver, a second driver, a terminal unit 40, a driving power supply line 60, and a common power supply line 70, may be located in the peripheral area PA. The first driver may include first and second light-emitting driving circuits 30 and 32. The second driver may include first and second scan driving circuits 20 and 22.

The first and second scan driving circuits 20 and 22 may be located in the peripheral area PA of the lower substrate 100. The first and second scan driving circuits 20 and 22 may generate a scan signal and transmit the scan signal to each pixel P through the scan line SL. In FIG. 1, the first scan driving circuit 20 is shown as being located at the left of the display unit 10 and the second scan driving circuit 22 is shown as being located at the right of the display unit 10. In some implementations, only one scan driving circuit may be provided.

The terminal unit 40 may be located at an end portion of the lower substrate 100. The terminal unit 40 may include a plurality of terminals 41, 42, 43, 44, and 45. The terminal unit 40 may be exposed without being covered by an insulating layer. The terminal unit 40 may be electrically connected to a flexible printed circuit board (FPCB). The terminal unit 40 may be located at a side of the lower substrate 100 where the first and second scan driving circuits 20 and 22 are not located.

The FPCB may electrically connect a controller 55 to the terminal unit 40. A signal or power transmitted from the controller 55 may be applied through connection wirings 21, 31, 41, 51, 61, and 71 connected to the terminal unit 40.

The controller 55 may receive a vertical synchronization signal, a horizontal synchronization signal, and a clock signal and may generate a control signal for controlling operations of the first and second scan driving circuits 20 and 22. The generated control signal may be transmitted to the first and second scan driving circuits 20 and 22 through the terminal 44 connected to the FPCB and the connection wirings 21 and 31. Scan signals of the first and second scan driving circuits 20 and 22 may be applied to each pixel P through the scan line SL. The controller 55 may supply driving power ELVDD and common power ELVSS to the driving power supply line 60 and the common power supply line 70 through the terminals 42 and 45 connected to the FPCB and the connection wirings 61 and 71. The driving power ELVDD may be supplied to each pixel P through the driving voltage line PL. The common power ELVSS may be supplied to a common electrode of the pixel P.

A data driving circuit 50 may be located on the FPCB. The data driving circuit 50 may apply a data signal to each pixel P. The data signal of the data driving circuit 50 may be applied to each pixel P through the connection wiring 51 connected to the terminal 41 and the data line DL connected to the connection wiring 51. As shown in FIG. 1, the data driving circuit 50 may be located on the FPCB. In some implementations, the data driving circuit 50 may be located in the peripheral area PA of the lower substrate 100.

The driving power supply line 60 may be located in the peripheral area PA. For example, the driving power supply line 60 may be located between the terminal unit 40 and a portion of the display unit 10 adjacent to the terminal unit 40. The driving power ELVDD supplied through the connection wiring 61 connected to the terminal 41 may be supplied to each pixel P through the driving voltage line PL.

The common power supply line 70 may be located in the peripheral area PA and may partially surround the display unit 10. For example, the common power supply line 70 may have a loop shape. A side of the loop shape adjacent to the terminal unit 40 may be open and may extend along edges of the lower substrate 100 excluding the terminal unit 40.

The common power supply line 70 may be electrically connected to the connection wiring 71 connected to the terminal 45. The common power supply line 70 may supply the common power ELVSS to a common electrode (e.g., a cathode) of the OLED of the pixel P. In FIG. 1, the connection wiring 71 is shown as contacting an end portion and an other end portion of the common power supply line 70. In some implementations, the connection wiring 71 may have a loop shape that partially surrounds the display unit 10 and has an open side. When the connection wiring 71 contacts the end portion and the other end portion of the common power supply line 70 and when the connection wiring 71 partially surrounds the display unit 10, the connection wiring 71 may extend beyond the common power supply line 70 toward an end portion of the lower substrate 100, for example, toward the terminal unit 40.

The first and second light-emitting driving circuits 30 and 32 may be located in the peripheral area PA of the lower substrate 100. The first and second light-emitting driving circuits 30 and 32 may generate an emission control signal and transmit the emission control signal to each pixel P through an emission control line. In an embodiment, the first light-emitting driving circuit 30 may be located at the left of the display unit 10 and the second light-emitting driving circuit 32 may be located at the right of the display unit 10. In some implementations, only one light-emitting driving circuit may be provided.

Referring to FIG. 1, the first and second scan driving circuits 20 and 22 may be located adjacent to the display unit 10, and the first and second light-emitting driving circuits 30 and 32 may be located relatively adjacent to an edge of the lower substrate 100. In this case, the first and second light-emitting driving circuits 30 and 32 may overlap the common power supply line 70 and may be located under the common power supply line 70.

An upper substrate 300 may be located on the lower substrate 100 to face the lower substrate 100. A seal 400 may be located between the lower substrate 100 and the upper substrate 300. The seal 400 may surround the display unit 10 in the plan view of FIG. 1. A space defined by the lower substrate 100, the upper substrate 300, and the seal 400 may be separated from an external space to prevent penetration of external moisture or impurities. The seal 400 may include, for example, an inorganic material such as fit. In some implementations, the seal 400 may include epoxy.

Referring to FIG. 1, the seal 400 may entirely surround the display unit 10 and the first and second scan driving circuits 20 and 22. The display unit 10 and the first and second scan driving circuits 20 and 22 may be located in a space, for example, an inner space, defined by the lower substrate 100, the upper substrate 300, and the seal 400.

The seal 400 may be located such that at least a part of the seal 400 and the common power supply line 70 overlap each other in the z direction. The first and second light-emitting driving circuits 30 and 32 may be located under the common power supply line 70 to overlap the common power supply line 70 in the z direction, and may also overlap the seal 400 in the z direction.

A first thermally conductive layer 80 may be located in the peripheral area PA of the lower substrate 100. The first thermally conductive layer 80 may be located such that a part of the first thermally conductive layer 80 overlaps the seal 400 and the common power supply line 70 in the z direction. The first thermally conductive layer 80 may extend to an outermost portion including the edges of the lower substrate 100. The first thermally conductive layer 80 may outwardly discharge heat produced by laser energy emitted to cure the seal 400.

Referring to FIG. 1, the first thermally conductive layer 80 may have an open loop shape and may surround a part of the display unit 10. The first thermally conductive layer 80 may be located along three edges of the lower substrate 100. In some implementations, a width and a structure of the first thermally conductive layer 80 may be modified according to a desired heat dissipation efficiency, as will be described in detail with reference to FIG. 3 and other figures.

Figure 3:
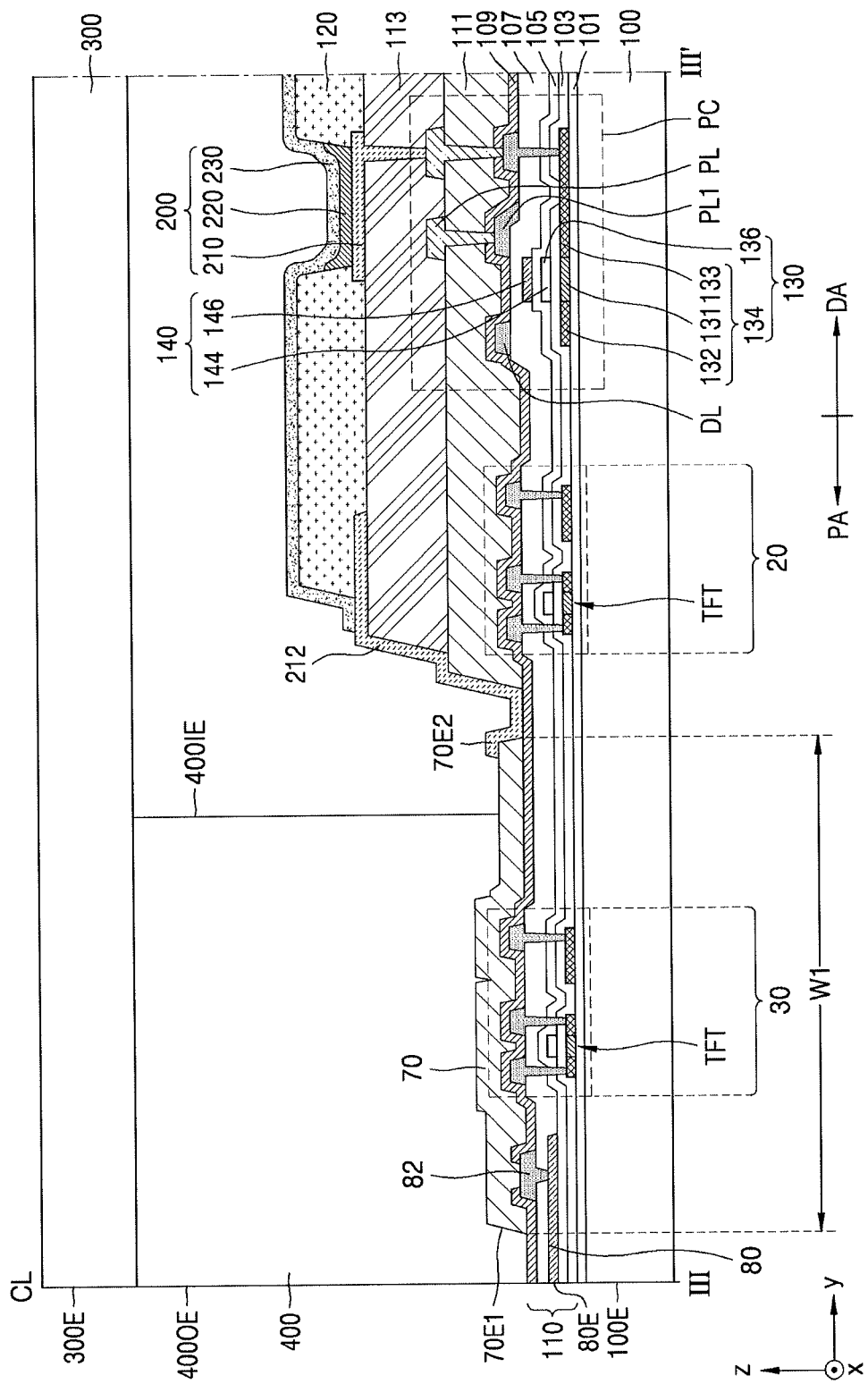
FIG. 3 illustrates a cross-sectional view of a display apparatus according to an embodiment.

FIG. 3 illustrates a cross-sectional view of a display apparatus according to an embodiment. FIG. 3 shows a view taken along line III-III' of FIG. 1.

Referring to FIG. 3, the display apparatus may include the display area DA and the peripheral area PA. Each of the lower substrate 100 and the upper substrate 300 may include the display area DA and the peripheral area PA.

The lower substrate 100 may include a suitable material such as a glass material, a metal material, or a plastic material (e.g., polyethylene terephthalate (PET), polyethylene naphthalate (PEN), or polyimide). The upper substrate 300 may include a transparent material. For example, the upper substrate 300 may include a suitable material such as a glass material or a plastic material (e.g., PET, PEN, or polyimide). The lower substrate 100 and the upper substrate 300 may include the same material or different materials.

Referring to the display area DA of FIG. 3, a buffer layer 101 may be formed on the lower substrate 100. The buffer layer 101 may prevent moisture or a foreign material from penetrating through the lower substrate 100. For example, the buffer layer 101 may include an inorganic material such as silicon oxide (SiOx), silicon nitride (SiNx), or/and silicon oxynitride (SiON), and may have a single layer structure or a multi-layer structure.

A TFT 130 and a storage capacitor 140 may be provided to correspond to the display area DA. A display device 200 may be electrically connected to the TFT 130. The display device may be an OLED. The storage capacitor 140 may be located on the lower substrate 100. The TFT 130 of FIG. 3 may correspond to one of TFTs, e.g., the driving TFT Td, provided in the pixel circuit PC of FIG. 2. The storage capacitor 140 of FIG. 3 may correspond to the storage capacitor Cst of FIG. 2.

The TFT 130 may include a semiconductor layer 134 and a gate electrode 136. The semiconductor layer 134 may include, for example, polysilicon. The semiconductor layer 134 may include a channel region 131 overlapping the gate electrode 136 and a source region 132 and a drain region 133 located at both sides of the channel region 131 and having a higher impurity concentration than the channel region 131. Impurities may include N-type impurities or P-type impurities. The source region 132 and the drain region 133 may be understood respectively as a source electrode and a drain electrode of the TFT 130.

The semiconductor layer 134 may include polysilicon. In some implementations, the semiconductor layer 134 may include amorphous silicon or an organic semiconductor material. In another implementations, the semiconductor layer 134 may include an oxide semiconductor.

The pixel circuit PC may include the driving TFT Td and the switching TFT Ts of FIG. 2. A semiconductor layer of the driving TFT Td and a semiconductor layer of the switching TFT Ts may include different materials. For example, one of the semiconductor layers of the TFT Td and the switching TFT Ts may include an oxide semiconductor, and the remaining one may include polysilicon.

A gate insulating layer 103 may be located between the semiconductor layer 134 and the gate electrode 136. The gate insulating layer 103 may be an inorganic insulating layer formed of SiON, SiOx, and/or SiNx. The inorganic insulating layer may have a single layer structure or a multi-layer structure.

The storage capacitor 140 may include a lower electrode 144 and an upper electrode 146 overlapping each other in the z direction. A first interlayer insulating layer 105 may be located between the lower electrode 144 and the upper electrode 146.

The first interlayer insulating layer 105, which is a layer having a predetermined dielectric constant, may be an inorganic insulating layer formed of SiON, SiOx, and/or SiNx. The first interlayer insulating layer 105 may be formed to have a single layer structure or a multi-layer structure. As shown in FIG. 3, the storage capacitor 140 may overlap the TFT 130. As shown in FIG. 3, the lower electrode 144 of the storage capacitor 140 may also serve as the gate electrode 136 of the TFT 130. In some implementations, the storage capacitor 140 may not overlap the TFT 130, and the lower electrode 144 may be an independent element separate from the gate electrode 136 of the TFT 130.

The storage capacitor 140 may be covered by a second interlayer insulating layer 107. The second interlayer insulating layer 107 may be an inorganic insulating layer formed of SiON, SiOx, and/or SiNx, and may be formed to have a single layer structure or a multi-layer structure.

The driving voltage line PL may be located on a first organic insulating layer 111. The driving voltage line PL may include aluminum (Al), copper (Cu), or titanium (Ti) and may be formed to have a single layer structure or a multi-layer structure. In an embodiment, the driving voltage line PL may have a multi-layer structure formed of Ti/Al/Ti.

In FIG. 3, a lower driving voltage line PL1 may be located under the first organic insulating layer 111. The lower driving voltage line PL1 may be electrically connected to the driving voltage line PL through a contact hole passing through the first organic insulating layer 111. The lower driving voltage line PL1 may prevent a voltage drop of the driving voltage ELVDD applied through the driving voltage line PL. The lower driving voltage line PL1 may include the same material as the data line DL. For example, each of the lower driving voltage line PL1 and the data line DL may include Al, Cu, or Ti, and may be formed to have a single layer structure or a multi-layer structure. In an embodiment, each of the lower driving voltage line PL1 and the data line DL may have a multi-layer structure formed of Ti/Al/Ti or TiN/Al/Ti.

The first organic insulating layer 111 may include an organic insulating material. The organic insulating material may include an imide-based polymer, a general-purpose polymer such as polymethylmethacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, and/or a blend thereof. In an embodiment, the first organic insulating layer 111 may include polyimide.

The driving voltage line PL may be covered by a second organic insulating layer 113. The second organic insulating layer 113 may include an imide-based polymer, a general-purpose polymer such as PMMA or PS, a polymer derivative having a phenol-based group, an acryl-based polymer, an aryl ether-based polymer, an amide-based polymer, a fluorine-based polymer, a p-xylene-based polymer, a vinyl alcohol-based polymer, and/or a blend thereof. In an embodiment, the second organic insulating layer 113 may include polyimide.

A pixel electrode 210 may be located on the second organic insulating layer 113. A pixel-defining film 120 may be located on the pixel electrode 210. The pixel-defining film 120 may have an opening that corresponds to each sub-pixel At least a central portion of the pixel electrode 210 may be exposed through the opening to define a pixel. The pixel-defining film 120 may increase a distance between an edge of the pixel electrode 210 and a common electrode 230, thereby preventing an arc or the like from occurring between the edge of the pixel electrode 210 and the common electrode 230. The pixel-defining film 120 may be formed of an organic material such as polyimide or hexamethyldisiloxane (HMDSO).

An intermediate layer 220 may include a low-molecular-weight material or a high-molecular-weight material. When the intermediate layer 220 includes a low-molecular-weight material, the intermediate layer 220 may have a stacked structure of a hole injection layer (HIL), a hole transport layer (HTL), an emission layer (EML), an electron transport layer (ETL), and/or an electron injection layer (EIL), and may include any of various organic materials such as copper phthalocyanine (CuPc), N,N'-di(naphthalene-1-yl)-N,N'-diphenyl-benzidine (NPB), or tris-8-hydroxyquinoline aluminum (Alq3). Such layers may be formed by using vacuum deposition.

When the intermediate layer 220 includes a high-molecular-weight material, the intermediate layer 220 may have a structure including an HTL and an EML. In this case, the HTL may include poly(3,4-ethylenedioxythiophene) (PEDOT), and the EML may include a high-molecular-weight material such as a poly-phenylenevinylene (PPV)-based material or a polyfluorene-based material. The intermediate layer 220 may have any of various other structures. For example, at least one of layers constituting the intermediate layer 220 may be integrally formed over a plurality of the pixel electrodes 210. In some implementations, the intermediate layer 220 may include a layer that is patterned to correspond to each of the plurality of pixel electrodes 210.

The common electrode 230 may be located over the display area DA to cover the display area DA. The common electrode 230 may be integrally formed to cover a plurality of pixels.

A filler may be located between the common electrode 230 and the upper substrate 300. The filler may include, for example, at least one of a photocurable epoxy-based material and an acrylate-based material.

Referring to the peripheral area PA of FIG. 3, a driving circuit including, for example, a first driver and a second driver, may be located on the lower substrate 100. The first driver may be the first light-emitting driving circuit 30, and the second driver may be the first scan driving circuit 20.

Each of the first scan driving circuit 20 and the first light-emitting driving circuit 30 may include TFTs and a wiring connected to the TFTs. The TFTs may be formed in the same process as that used to form the TFT 130 of the pixel circuit PC.

Each of the first scan driving circuit 20 and the first light-emitting driving circuit 30 may include an insulating layer located between elements (e.g., a semiconductor layer and a gate electrode) constituting the TFTs. For example, at least one of the buffer layer 101, the gate insulating layer 103, and the first and second interlayer insulating layers 105 and 107 may extend to the peripheral area PA to form an insulating layer 110. The insulating layer 110 includes an inorganic insulating material.

The first scan driving circuit 20 may be located closer to the display area DA than the first light-emitting driving circuit 30. As shown in FIG. 3, portions, portions of the first and second organic insulating layers 111 and 113 on the first scan driving circuit 20 may extend to the peripheral area PA to cover the first scan driving circuit 20. In some implementations, the first and second organic insulating layers 111 and 113 may not cover the first scan driving circuit 20, and only an inorganic insulating layer 109 may be located on the first scan driving circuit 20.

The first scan driving circuit 20 and the first light-emitting driving circuit 30 may be covered by the inorganic insulating layer 109. The inorganic insulating layer 109 may prevent the connection wiring 71 including a metal such as Al, which is susceptible to damage from an etchant used in a process of manufacturing the display apparatus, from being exposed to an etching environment. As shown in FIG. 3, the inorganic insulating layer 109 may also located in the display area DA.

The inorganic insulating layer 109 may include an inorganic material such as SiOx, SiNx, or/and SiON, and may be formed to have a single layer structure or a multi-layer structure. In an embodiment, the inorganic insulating layer 109 may include SiNx. The inorganic insulating layer 109 may have a thickness equal to or greater than about 500 Å. In some implementations, a thickness of the inorganic insulating layer 109 may be equal to or greater than 1,000 Å, equal to or greater than 1,500 Å, equal to or greater than 2,000 Å, equal to or greater than 2,500 Å, equal to or greater than 3,000 Å, equal to or greater than 3,500 Å, equal to or greater than 4,000 Å, equal to or greater than 4,500 Å, equal to or greater than 5,000 Å, equal to or greater than 5,500 Å, equal to or greater than 6,000 Å, or equal to or greater than 6,500 Å. In some implementations, the inorganic insulating layer 109 may have a thickness ranging from about 7,000 Å to about 10,000 Å.

The common power supply line 70 may overlap the first light-emitting driving circuit 30 with the inorganic insulating layer 109 therebetween. The common power supply line 70 may include the same material as the driving voltage line PL. A first end portion 70E1 of the common power supply line 70 may be covered by the seal 400. A second end portion 70E2 that is opposite to the first end portion 70E1 may extend toward the display area DA and may be covered by a conductive film 212.

In an embodiment, the second end portion 70E2 of the common power supply line 70 may further extend toward the display area DA and may contact the first organic insulating layer 111 and/or the second organic insulating layer 113. In an embodiment, the second end portion 70E2 of the common power supply line 70 may be covered by the seal 400, like the first end portion 70E1.

The seal 400 may overlap the first light-emitting driving circuit 30 and the common power supply line 70. The seal 400 may adhere the lower substrate 100 to the upper substrate 300 with the first light-emitting driving circuit 30 and the common power supply line 70 therebetween.

When the display apparatus includes the seal 400 and is manufactured by using a method of cutting a panel in the present embodiment, the lower substrate 100, the seal 400, and the upper substrate 300 may be cut together along a cutting line CL in a manufacturing process. Accordingly, an edge 100E of the lower substrate 100, an edge 300E of the upper substrate 300, and an outer wall 400OE of the seal 400 may be aligned with one another, and may be on the same plane, for example, on the same vertical plane.

A first thermally conductive layer 80 may be located between the common power supply line 70 and the lower substrate 100. At least a part of the first thermally conductive layer 80 may overlap the first end portion 70E1 of the common power supply line 70. The first thermally conductive layer 80 may extend to the edge 100E of the lower substrate 100. Accordingly, an end surface 80E of an end portion of the first thermally conductive layer 80 may be exposed to the outside of the panel. As described above, the end surface 80E of the first thermally conductive layer 80 may be aligned with the edge 100E of the lower substrate 100, the edge 300E of the upper substrate 300, and the outer wall 400OE of the seal 400.

As shown in FIG. 3, the first thermally conductive layer 80 and the upper electrode 146 of the pixel circuit PC of the display area DA may be located on the same layer and may include the same material. In an embodiment, the first thermally conductive layer 80 and at least one of the data line DL of the pixel circuit PC, the upper electrode 146, and the gate electrode 136 may be located on the same layer and may include or be made of the same material.

The first thermally conductive layer 80 may be physically connected to the common power supply line 70 with a first connection layer 82 therebetween. As shown in FIG. 3, the first connection layer 82 and the data line DL of the pixel circuit PC are located on the same layer and include the same material. The first connection layer 82 may be located between the first light-emitting driving circuit 30 and the edge 100E of the lower substrate 100.

In a general method, a driver such as a first light-emitting driving circuit and a common power supply line are located in a region separate from a seal, unlike in the present disclosure, and thus a dead area that is a non-emitting portion may be increased.

In the present disclosure, a dead area may be reduced by locating the first light-emitting driving circuit 30 in the peripheral area PA to be under the common power supply line 70, thereby allowing the first light-emitting driving circuit 30 and the common power supply line 70 to overlap each other, and allowing the seal 400 to overlap at least a part of the common power supply line 70.

However, in this structure, in a curing process of emitting laser energy to the seal 400 to adhere the lower substrate 100 to the upper substrate 300 through the seal 400, the first light-emitting driving circuit 30 located under the seal 400 may be susceptible to damage due to heat. Even if damage to the first light-emitting driving circuit 30 were to be prevented by increasing a width W1 of the common power supply line 70 between the seal 400 and the first light-emitting driving circuit 30, heat transferred to the common power supply line 70 may not be dissipated to the outside but may be transferred to the first light-emitting driving circuit 30 located under the common power supply line 70.

In the display apparatus according to an embodiment, heat applied to the common power supply line 70 due to laser energy in a process of curing the seal 400 after the lower substrate 100 is adhered to the upper substrate 300 may be easily diffused to the outside of the panel by locating the first thermally conductive layer 80 under the common power supply line 70.

Figure 4:
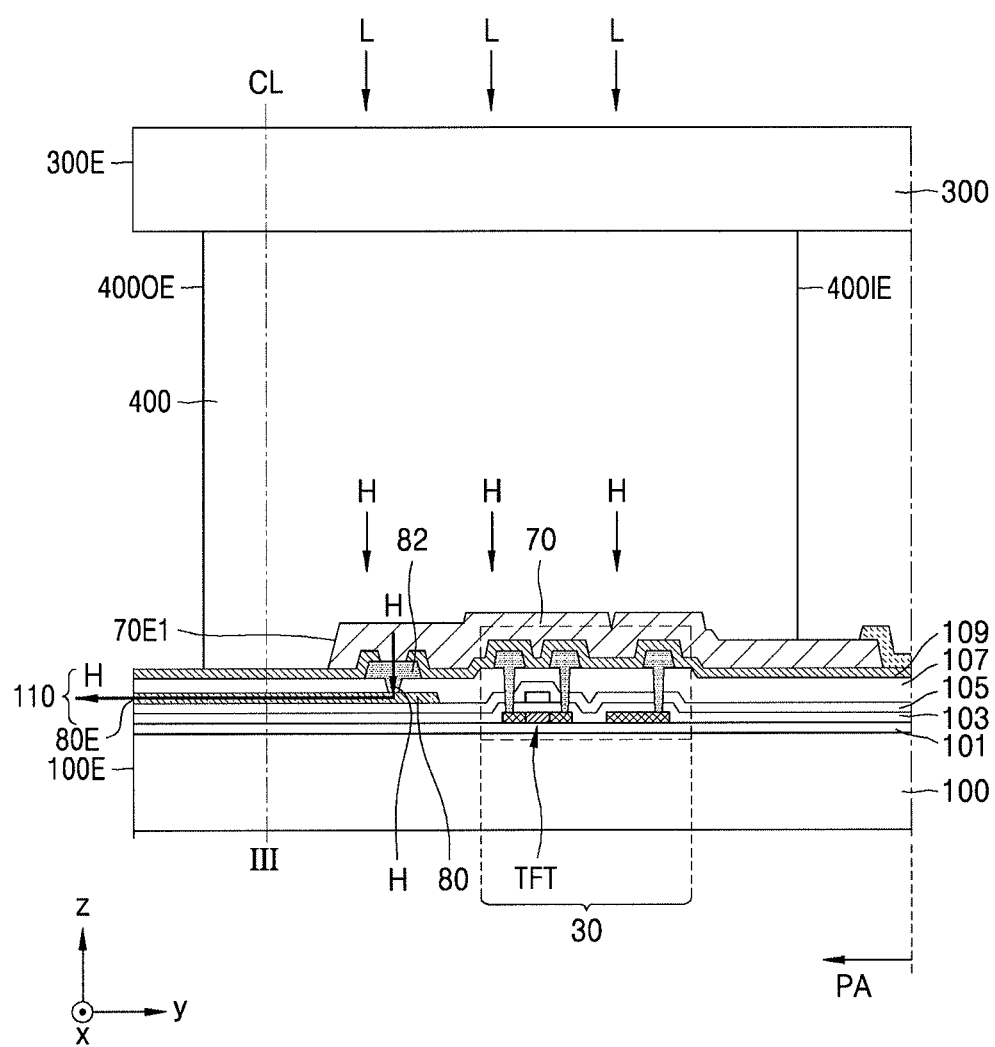
FIG. 4 illustrates a cross-sectional view of a stage of a process of manufacturing the display apparatus of FIG. 1.

FIG. 4 illustrates a cross-sectional view of a stage of a process of manufacturing the display apparatus of FIG. 1.

Referring to FIG. 4, a process of curing the seal 400 may be performed in the peripheral area PA of the display apparatus by emitting laser energy L after the lower substrate 100 has been adhered to the upper substrate 300. A display panel may be formed by simultaneously cutting the upper substrate 300, the seal 400, the lower substrate 100, and the first thermally conductive layer 80 along the cutting line CL.

In FIG. 4, the laser energy L is emitted from the upper substrate 300 toward the seal 400. The laser energy L provides high temperature heat H. The heat H transferred to cure the seal 400 may be transferred to the common power supply line 70, which is a conductive layer that is in surface contact with the seal 400.

In the present embodiment, the heat H transferred to the common power supply line 70 may be transferred to the first thermally conductive layer 80 connected to the common power supply line 70 through the first connection layer 82. The heat H may be diffused to the outside of the panel along the first thermally conductive layer 80. Accordingly, in the display apparatus according to an embodiment, a dead area may be reduced by locating the seal 400, the common power supply line 70, and the first light-emitting driving circuit 30 to overlap each other. Deterioration of the first light-emitting driving circuit 30 in a process of curing of the seal 400 may be prevented or reduced by providing the first thermally conductive layer 80 having a heat dissipation structure.

Figure 5:
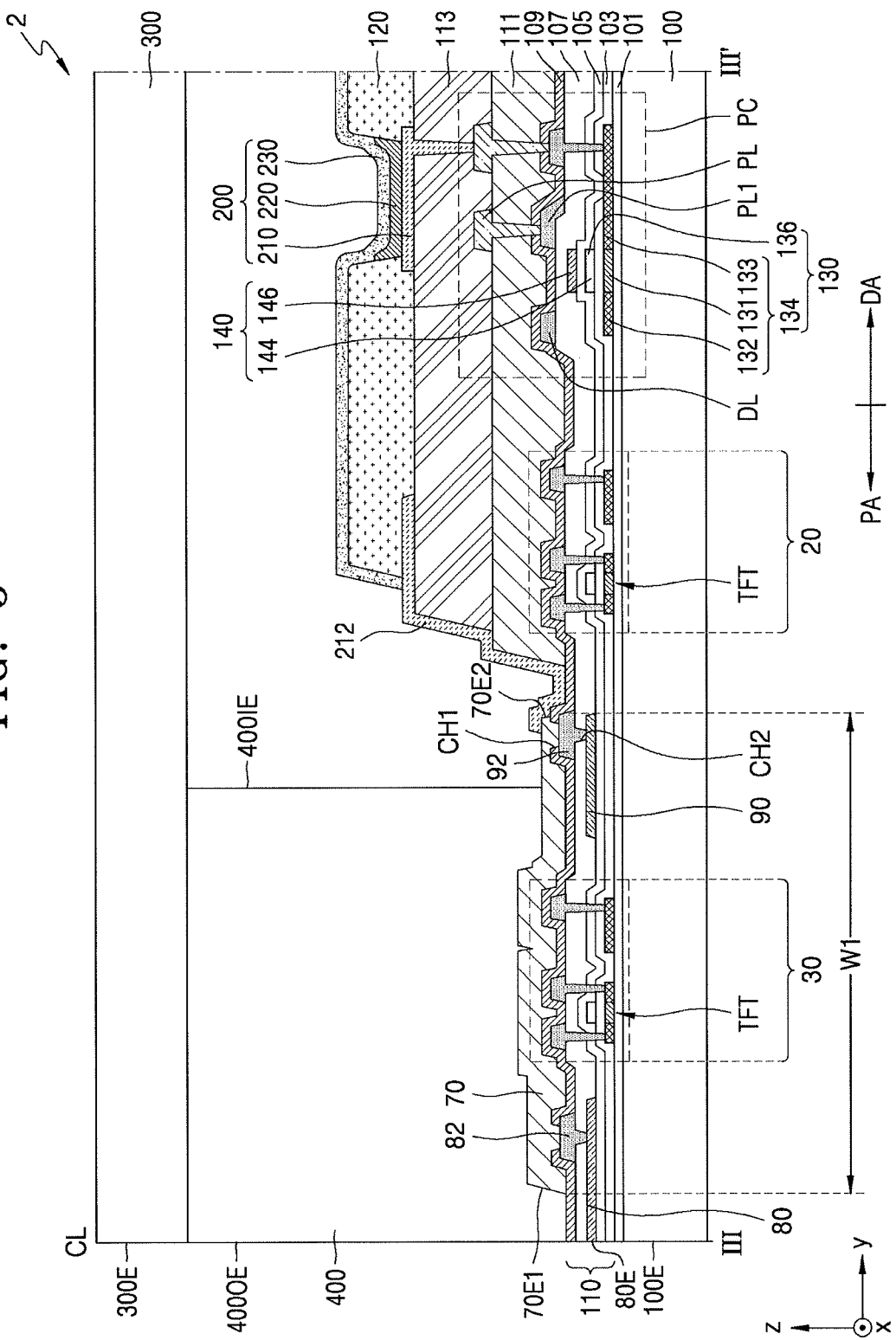
FIG. 5 illustrates a cross-sectional view of a display apparatus according to another embodiment.

FIG. 5 illustrates a cross-sectional view of a display apparatus 2 according to an embodiment.

The display apparatus 2 of FIG. 5, as compared to the embodiment of FIG. 3, further includes a second thermally conductive layer 90 located under the common power supply line 70. The display area DA other than the peripheral area PA may be the same as that of FIG. 3 Thus an explanation thereof will not be repeated and the following will focus on differences.

In FIG. 5, the second thermally conductive layer 90 may be located between the common power supply line 70 and the lower substrate 100. The second thermally conductive layer 90 may overlap the second end portion 70E2 of the common power supply line 70. A side of the second thermally conductive layer 90 may be substantially aligned with the second end portion 70E2 of the common power supply line 70, and the other side of the second thermally conductive layer 90 may extend toward the first light-emitting driving circuit 30. In this case, the second thermally conductive layer 90 may be spaced apart from the first light-emitting driving circuit 30 by a predetermined interval.

In FIG. 5, the second thermally conductive layer 90 and the upper electrode 146 of the pixel circuit PC of the display area DA may be located on the same layer and may include the same material. In an embodiment, the second thermally conductive layer 90 and at least one of the data line DL of the pixel circuit PC, the upper electrode 146, and the gate electrode 136 may be located on the same layer and may include the same material.

Although the first thermally conductive layer 80 and the second thermally conductive layer 90 are shown in FIG. 5 as being located on the same layer, in some implementations, the first thermally conductive layer 80 and the second thermally conductive layer 90 may be located on different layers.

The second thermally conductive layer 90 may be physically connected to the common power supply line 70 with a second connection layer 92 therebetween. When the second thermally conductive layer 90 is physically connected to the common power supply line 70, heat transferred to the common power supply line 70 may be diffused to the second thermally conductive layer 90 through the second connection layer 92.

For example, the second thermally conductive layer 90 and the second connection layer 92 may diffuse heat applied to the common power supply line 70 due to laser energy applied in a process of curing of the seal 400 after the lower substrate 100 is adhered to the upper substrate 300, in a similar manner as the first thermally conductive layer 80 and the first connection layer 82. However, since the end surface 80E of the first thermally conductive layer 80 is exposed to the outside of the panel whereas the second thermally conductive layer 90 does not have a portion exposed to the outside, the first thermally conductive layer 80 may perform a main heat dissipation function and the second thermally conductive layer 90 may perform an auxiliary heat dissipation function.

The first connection layer 82 and the data line DL of the pixel circuit PC may be located on the same player and include the same material. The first connection layer 82 may be located between the first light-emitting driving circuit 30 and the edge 100E of the lower substrate 100.

In FIG. 5, the first width W1 of the common power supply line 70 may be greater than a width of the first light-emitting driving circuit 30. The common power supply line 70 may cover the first light-emitting driving circuit 30. The first end portion 70E1 of the common power supply line 70 may extend toward the edge 100E of the lower substrate 100 and the second end portion 70E2 of the common power supply line 70 may extend toward the first scan driving circuit 20.

End portions of the second connection layer 92 and the second thermally conductive layer 90 may be substantially aligned with each other with respect to the second end portion 70E2 of the common power supply line 70. When the second connection layer 92 and the second thermally conductive layer 90 providing a path through which heat is diffused are located so that the end portions of the second connection layer 92 and the second thermally conductive layer 90 are substantially aligned with each other with respect to the second end portion 70E2 of the common power supply line 70, heat applied in forming the seal 400 may be prevented from being transferred to the first scan driving circuit 20 located adjacent to the display area DA.

The second connection layer 92 and the second end portion 70E2 of the common power supply line 70 may be connected through a first contact hole CH1 formed in the inorganic insulating layer 109. The second connection layer 92 may be connected through a second contact hole CH2 formed in the second interlayer insulating layer 107. As shown in FIG. 5, the first contact hole CH1 and the second contact hole CH2 may overlap each other.

Even if the first contact hole CH1 and the second contact hole CH2 were to not overlap each other, as in some implementations, the first contact hole CH1 and the second contact hole CH2 do not overlap the seal 400. When the first contact hole CH1 and the second contact hole CH2, providing a path through which heat applied in forming the seal 400 is diffused, do not overlap the seal 400, higher heat diffusion efficiency may be achieved.

Positions of the first contact hole CH1 and the second contact hole CH2 may be determined by a position of the second connection layer 92. Accordingly, when the first contact hole CH1 and the second contact hole CH2 do not overlap the seal 400, the second connection layer 92 may also not overlap the seal 400. For example, the second connection layer 92 may be located between an inner surface 400IE of the seal 400 and the first scan driving circuit 20.

Figure 6:
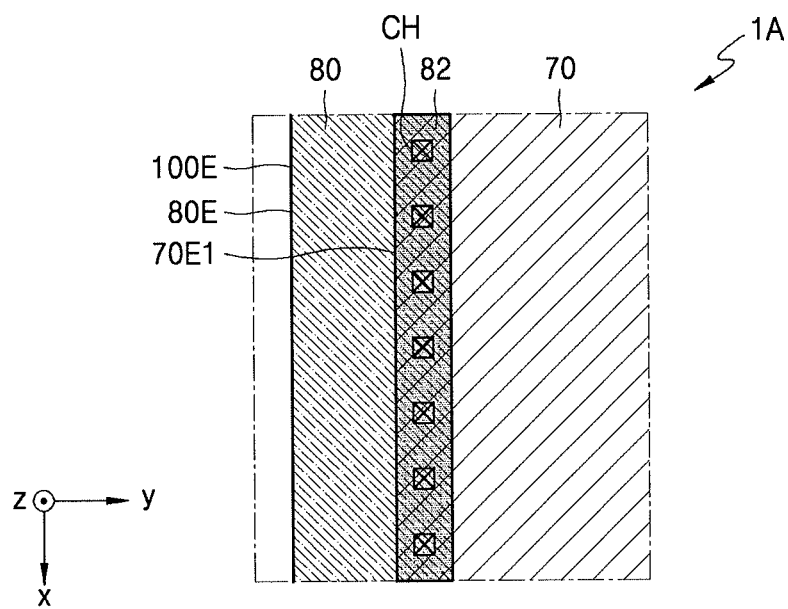
FIG. 6 illustrates a plan view of a portion of a display apparatus according to another embodiment.
Figure 7:
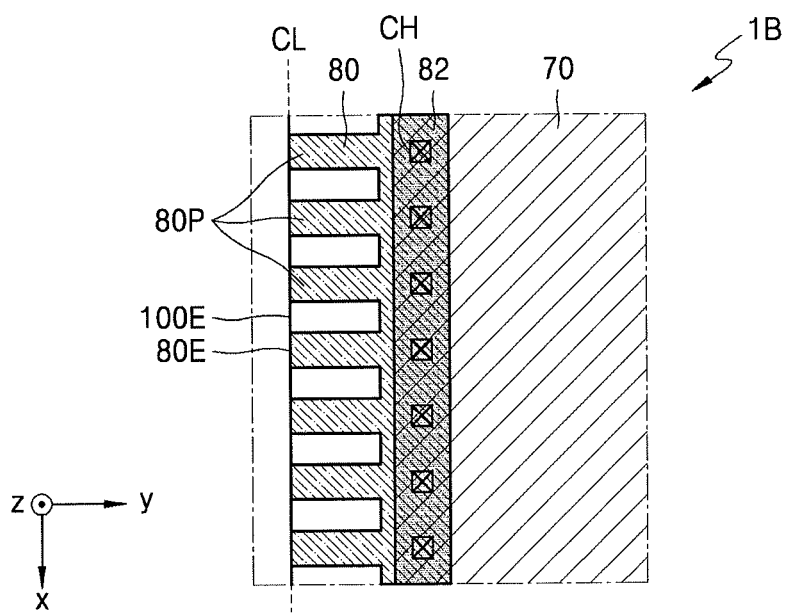
FIG. 7 illustrates a plan view of a portion of a display apparatus according to another embodiment.

FIG. 6 illustrates a plan view of a portion of a display apparatus 1A according to an embodiment. FIG. 7 illustrates a plan view of a part of a display apparatus 1B according to an embodiment. FIGS. 6 and 7 illustrate plan views of a structure of the first thermally conductive layer 80 overlapping the first end portion 70E1 of the common power supply line 70.

Referring to FIG. 6, at least a part of the first thermally conductive layer 80 may overlap the common power supply line 70. The first connection layer 82 may be located between the first thermally conductive layer 80 and the common power supply line 70. The end surface 80E of the first thermally conductive layer 80 may be aligned with the edge 100E of the lower substrate 100 and may be exposed to the outside, as shown in FIG. 3.

In FIG. 6, a left portion of the common power supply line 70 and a right portion of the first thermally conductive layer 80 may overlap each other. The first connection layer 82 may be located in overlapping portions of the common power supply line 70 and the first thermally conductive layer 80. The first connection layer 82 may be connected to the common power supply line 70 and the first thermally conductive layer 80 through a contact hole CH.

The first thermally conductive layer 80 may be integrally formed without an additional pattern for effective heat dissipation. For example, heat dissipation efficiency increases as the area of the first thermally conductive layer 80 increases. Accordingly the first thermally conductive layer 80 may be integrally formed as shown in the plan view of FIG. 1.

In a modified embodiment, at least a part of the first thermally conductive layer 80 including the end surface 80E of FIG. 7 may be formed to have a pattern 80P. As described with reference to FIG. 3, the upper substrate 300, the seal 400, the lower substrate 100, and the first thermally conductive layer 80 on the lower substrate 100 may be simultaneously cut along the cutting line CL. In this case, cutting the first thermally conductive layer 80 including a metal may be more difficult than cutting other structures, and metal fragments in the cutting process could be introduced into the panel in this cutting process.

Accordingly, a process of cutting the first thermally conductive layer 80 may be facilitated by patterning a portion of the first thermally conductive layer 80 corresponding to the cutting line CL and removing a part of the first thermally conductive layer 80.

A part of the first thermally conductive layer 80 is shown in FIG. 7 as having a slit shape including the pattern 80P In some implementations, the first thermally conductive layer 80 may have other suitable shapes.

Figure 8:
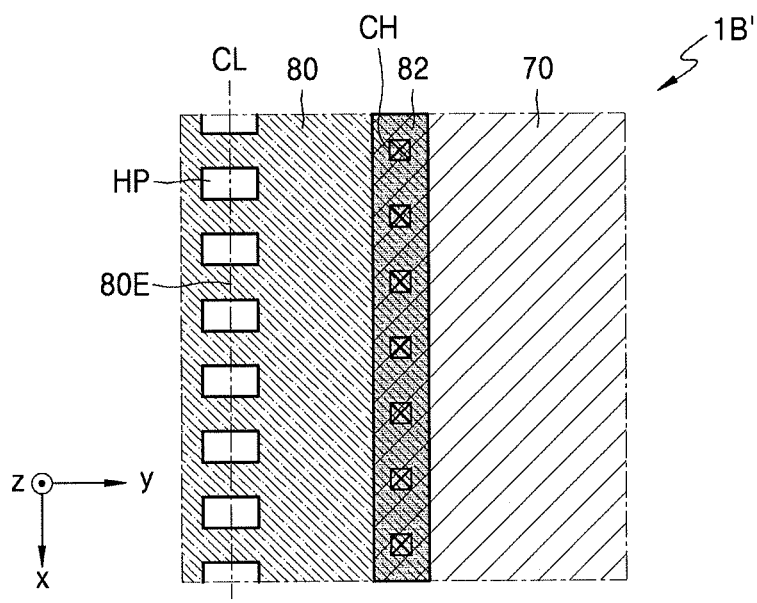
FIG. 8 illustrates a plan view of a portion of a display apparatus according to another embodiment.

FIG. 8 illustrates is a plan view of a display apparatus 1B' that is a modification of FIG. 7, illustrating a step before a cutting process. Referring to FIG. 8, the end surface 80E of the first thermally conductive layer 80 may be aligned with the cutting line CL. Accordingly, it is desirable that patterns of the first thermally conductive layer 80 be formed to correspond to the cutting line CL. Defects due to difficulty in cutting the first thermally conductive layer 80 during a cutting process may be reduced or prevented by continuously forming hole patterns HP in a portion corresponding to the cutting line CL. Heat dissipation efficiency of the first thermally conductive layer 80 may be improved by minimizing the area of the hole patterns HP formed in the portion corresponding to the cutting line CL to maximize the area of the first thermally conductive layer 80.

Figure 9:
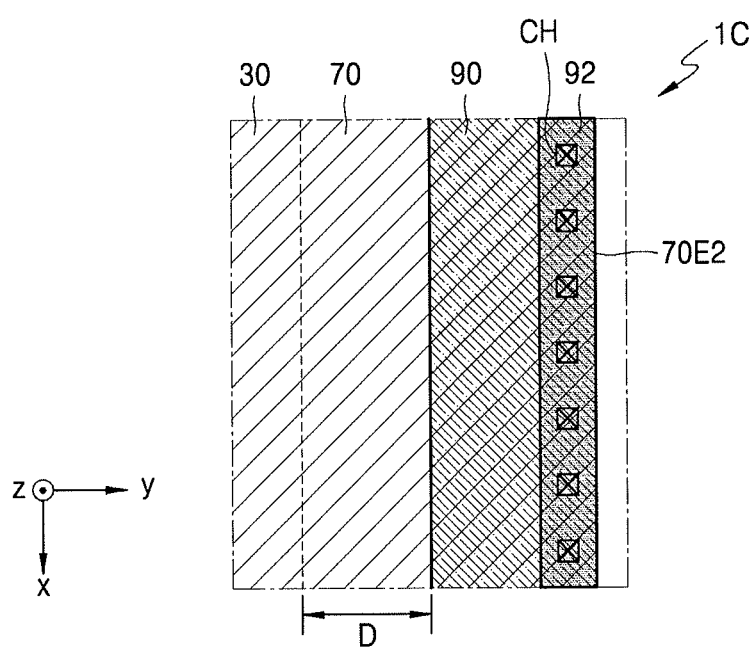
FIG. 9 illustrates a plan view of a portion of a display apparatus according to another embodiment.

FIG. 9 illustrates a plan view of a part of a display apparatus 1C according to an embodiment. FIG. 9 illustrates a plan view of a structure of the second thermally conductive layer 90 overlapping the second end portion 70E2 of the common power supply line 70.

In FIG. 9, a right portion of the common power supply line 70 and the second thermally conductive layer 90 completely overlap each other. The second connection layer 92 is located between the common power supply line 70 and the second thermally conductive layer 90. The second connection layer 92 is connected to the common power supply line 70 and the second thermally conductive layer 90 through a contact hole CH.

The second thermally conductive layer 90 has no issues regarding cutting, unlike the first thermally conductive layer 80. Accordingly, the second thermally conductive layer 90 may be integrally formed without a patterned portion. The second thermally conductive layer 90 may extend toward an edge of the lower substrate 100 that is opposite to a display area in order to minimize damage to an adjacent driving circuit that could be caused by heat transferred to the second thermally conductive layer 90. The second thermally conductive layer 90 may be spaced apart from the first light-emitting driving circuit 30 by a predetermined interval D.

Figure 10:
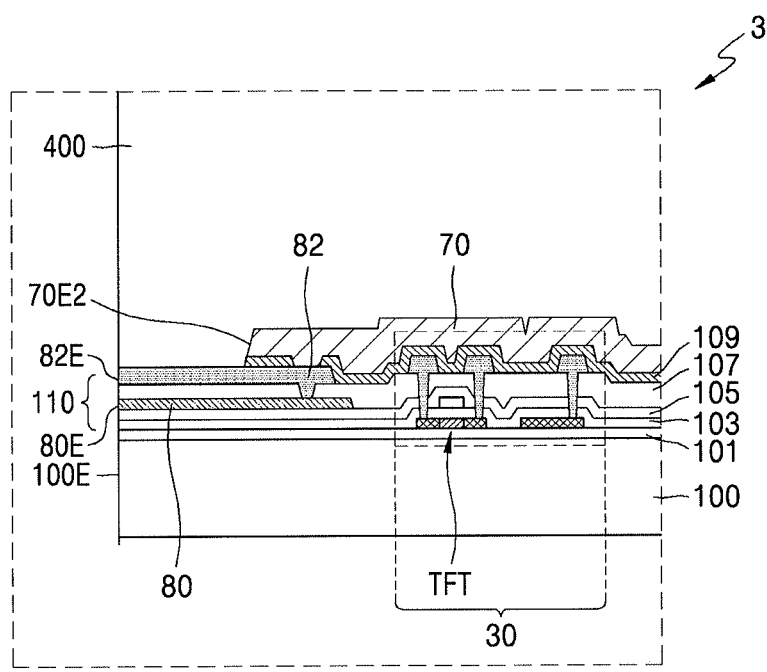
FIG. 10 illustrates a cross-sectional view of a portion of a display apparatus according to another embodiment.

FIG. 10 illustrates a cross-sectional view of a portion of a display apparatus 3 according to another embodiment. FIG. 10 illustrates a portion of the peripheral area PA including the edge 100E of the lower substrate 100 and a part of the seal 400.

The embodiment of FIG. 10 may be the same as one of the above embodiments except for structure of the first connection layer 82.

As shown in FIG. 10, the first connection layer 82 may extend to the edge 100E of the lower substrate 100. The end surface 82E of the first connection layer 82 and the edge 100E of the lower substrate 100 may be aligned with each other.

The end surface 82E of the first connection layer 82 may be exposed to the outside, like the end surface 80E of the first thermally conductive layer 80. Accordingly, the end surface 82E of the first connection layer 82 and the end surface 80E of the first thermally conductive layer 80 may be aligned with each other and may be on the same plane.

When the first connection layer 82 extends to the edge 100E of the lower substrate 100, like the first thermally conductive layer 80, and is exposed to the outside of a panel, higher heat dissipation efficiency may be achieved.

When the end surfaces 82E and 80E of the first connection layer 82 and the first thermally conductive layer 80 are exposed to the outside of the panel, in the end surfaces 82E and 80E could be susceptible to oxidation. Accordingly, a metal material included in each of the first connection layer 82 and the first thermally conductive layer 80 may include a metal that is less reactive than a metal material included in the common power supply line 70. For example, when the common power supply line 70 includes aluminum (Al), each of the first connection layer 82 and the first thermally conductive layer 80 may include molybdenum (Mo), which is less reactive than Al.

The configuration may apply even when only the end surface 80E of the first thermally conductive layer 80 is exposed to the outside of the panel.

By way of summation and review, various display apparatuses including an organic light-emitting display apparatus may display a predetermined image to a user. Research has been conducted to reduce a dead area where an image is not displayed in accordance with various consumer demands.

Embodiments relate to a display apparatus including a display area and a dead area, wherein damage to the display area due to heat in a manufacturing process of the display apparatus may be minimized and the dead area may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
a lower substrate including a display area and a peripheral area around the display area;
an upper substrate facing the lower substrate;
a display unit located in the display area, the display unit including a pixel circuit and a display device electrically connected to the pixel circuit;
a seal located in the peripheral area to surround the display unit, the seal adhering the lower substrate to the upper substrate;
a power supply line located between the lower substrate and the seal such that at least a portion of the power supply line and the seal overlap each other; and
a first thermally conductive layer located between the power supply line and the lower substrate, at least a part of the first thermally conductive layer overlapping an end portion of the power supply line, the first thermally conductive layer being connected to the power supply line and extending toward an edge of the lower substrate.

2. The display apparatus as claimed in claim 1, further comprising:
a first connection layer located between the power supply line and the first thermally conductive layer,
wherein the power supply line and the first thermally conductive layer are connected to each other through the first connection layer.

3. The display apparatus as claimed in claim 2, wherein the first connection layer extends to the edge of the lower substrate such that an end surface of the first connection layer and an end surface of the edge of the lower substrate are aligned with each other.

4. The display apparatus as claimed in claim 1, wherein an end surface of an end portion of the first thermally conductive layer is exposed to the outside.

5. The display apparatus as claimed in claim 4, wherein at least a part of the first thermally conductive layer including the end surface has a pattern.

6. The display apparatus as claimed in claim 4, wherein the end surface of the end portion of the first thermally conductive layer and an outer wall of the seal are on a same plane.

7. The display apparatus as claimed in claim 1, further comprising:
a first driver located under the power supply line and overlapping the seal, the first driver being located between the first thermally conductive layer and the display unit.

8. The display apparatus as claimed in claim 1, further comprising:
a second thermally conductive layer connected to the power supply line and located between the power supply line and the lower substrate, at least a part of the second thermally conductive layer and another end portion of the power supply line overlapping each other.

9. The display apparatus as claimed in claim 8, wherein the second thermally conductive layer and the first thermally conductive layer are made of a same material.

10. The display apparatus as claimed in claim 8, further comprising a second connection layer located between the power supply line and the second thermally conductive layer,
wherein the power supply line and the second thermally conductive layer are connected to each other through the second connection layer.

11. The display apparatus as claimed in claim 10, wherein the second connection layer is between the seal and the display unit.

12. The display apparatus as claimed in claim 8, further comprising:
a first driver in an area between the first thermally conductive layer and the second thermally conductive layer under the power supply line to overlap the seal; and
a second driver located in an area between the display unit and the second thermally conductive layer.

13. The display apparatus as claimed in claim 12, wherein the second thermally conductive layer extends toward the first driver.

14. The display apparatus as claimed in claim 12, wherein the first driver includes an emission control driving circuit and the second driver includes a scan driving circuit.

15. The display apparatus as claimed in claim 1, wherein the pixel circuit of the display unit includes:
- a thin-film transistor including a semiconductor layer, a gate electrode that at least partially overlaps the semiconductor layer, and a first conductive layer including at least one of a source electrode and a drain electrode;
- a storage capacitor located between the gate electrode and the first conductive layer, the storage capacitor including an upper electrode that at least partially overlaps the gate electrode; and
- a second conductive layer located on the first conductive layer.

16. The display apparatus as claimed in claim 15, wherein the power supply line and the second conductive layer are made of a same material.

17. The display apparatus as claimed in claim 15, wherein the first thermally conductive layer and the upper electrode are made of a same material.

18. The display apparatus as claimed in claim 15, further comprising:
- a first interlayer insulating layer located between the gate electrode and the upper electrode;
- a second interlayer insulating layer located between the upper electrode and the first conductive layer; and
- an inorganic insulating layer located between the upper electrode and the second conductive layer,
- wherein the first interlayer insulating layer, the second interlayer insulating layer, and the inorganic insulating layer extend to the edge of the lower substrate, and the power supply line is located on the inorganic insulating layer.

19. The display apparatus as claimed in claim 1, wherein outer walls of the lower substrate, the upper substrate, and the seal are aligned with one another.

20. The display apparatus as claimed in claim 1, wherein the first thermally conductive layer includes a metal material that is less reactive than a metal material of the power supply line.

* * * * *